US006885205B2

(12) United States Patent
Siew et al.

(10) Patent No.: US 6,885,205 B2
(45) Date of Patent: Apr. 26, 2005

(54) TEST FIXTURE ASSEMBLY FOR PRINTED CIRCUIT BOARDS

(75) Inventors: Ying Choy Siew, Singapore (SG); Thing Siong Loo, Singapore (SG)

(73) Assignee: Seagate Technology LLC, Scotts Valley, CA (US)

( * ) Notice: Subject to any disclaimer, the term of this patent is extended or adjusted under 35 U.S.C. 154(b) by 86 days.

(21) Appl. No.: 09/925,085

(22) Filed: Aug. 8, 2001

(65) Prior Publication Data

US 2002/0070741 A1 Jun. 13, 2002

Related U.S. Application Data

(60) Provisional application No. 60/255,262, filed on Dec. 13, 2000.

(51) Int. Cl.[7] .............................................. G01R 31/02
(52) U.S. Cl. ....................... 324/755; 324/754
(58) Field of Search ................................ 324/754–765, 324/158.1, 72.5

(56) References Cited

U.S. PATENT DOCUMENTS

| | | | | |
|---|---|---|---|---|
| 5,436,567 A | * | 7/1995 | Wexler et al. .............. | 324/754 |
| 5,828,223 A | * | 10/1998 | Rabkin et al. .............. | 324/754 |
| 5,909,124 A | | 6/1999 | Madine et al. .............. | 324/761 |
| 6,191,597 B1 | | 2/2001 | Driller et al. ............... | 324/758 |
| 6,219,811 B1 | | 4/2001 | Gruetzner et al. .......... | 714/726 |
| 6,225,817 B1 | | 5/2001 | Sayre et al. ................ | 324/754 |

* cited by examiner

*Primary Examiner*—David A. Zarneke
*Assistant Examiner*—Paresh Patel
(74) *Attorney, Agent, or Firm*—Westman, Champlin & Kelly P.A.

(57) ABSTRACT

A test system for testing operation of a circuit board. The test system includes a fixture for providing an electrical interface between a test engine or device and a particular circuit board. The test fixture is loaded and clamped or secured relative to an actuator which moves the fixture from a first position spaced from the test engine to a second position to electrically connect with circuitry of the test engine to install the fixture for operation.

22 Claims, 10 Drawing Sheets

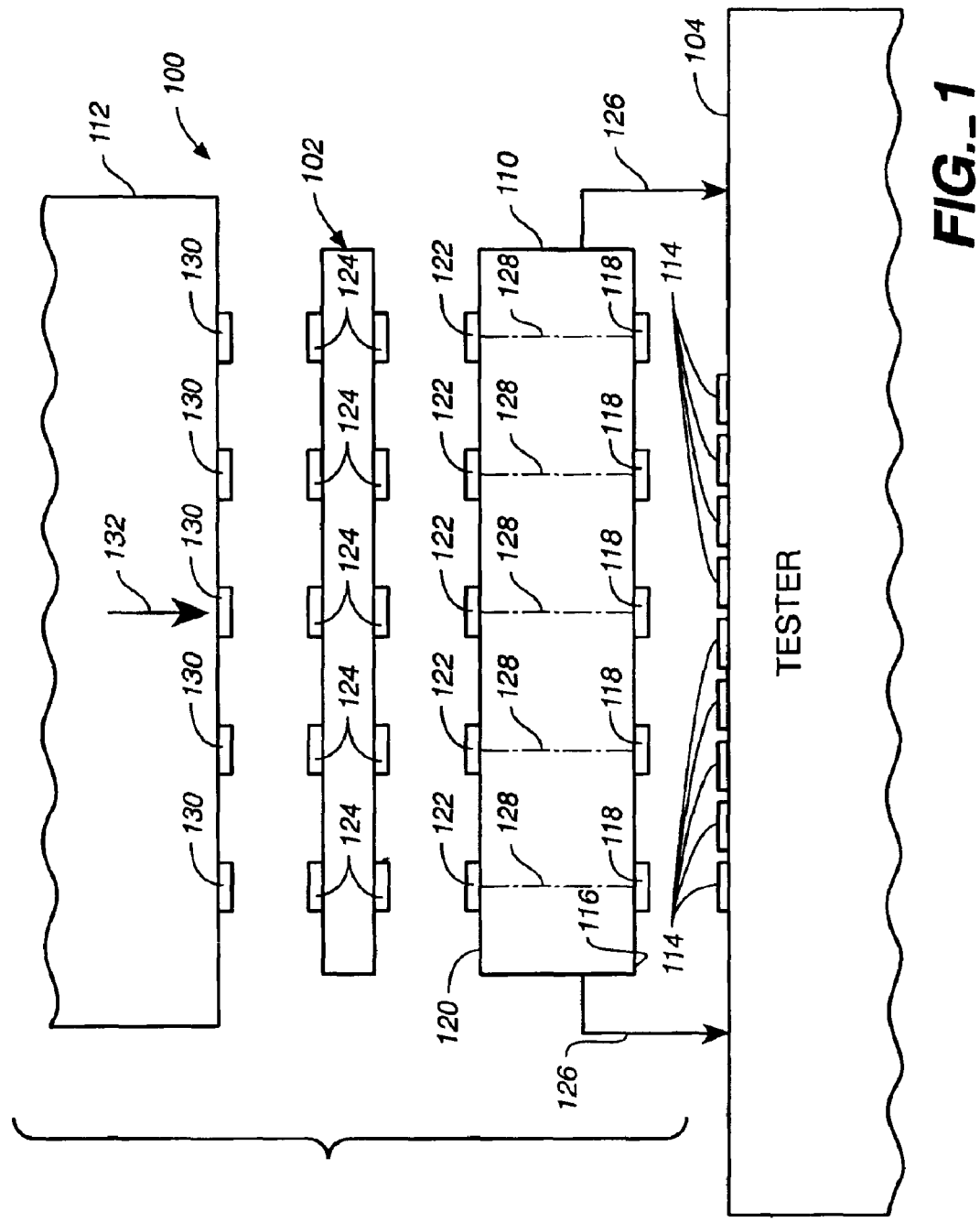
FIG._1

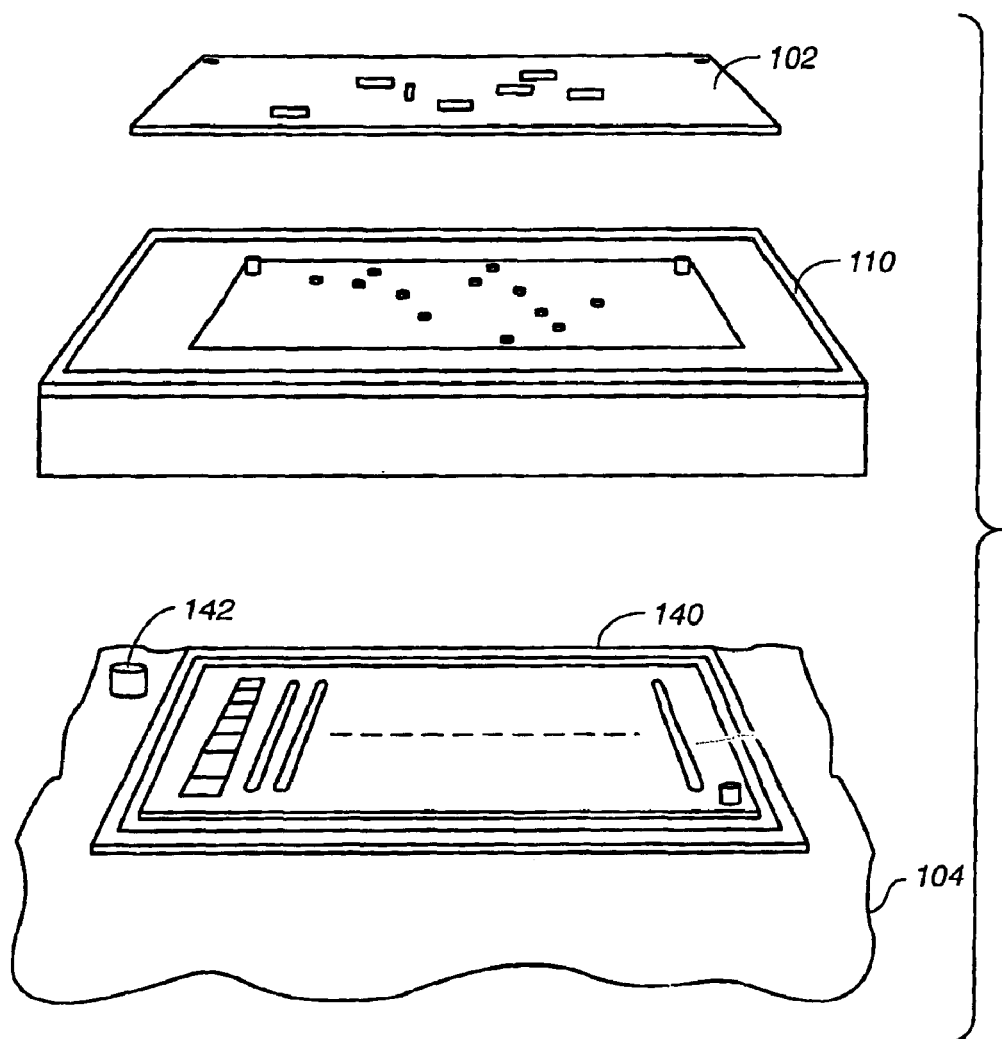
FIG._ 2
(PRIOR ART)

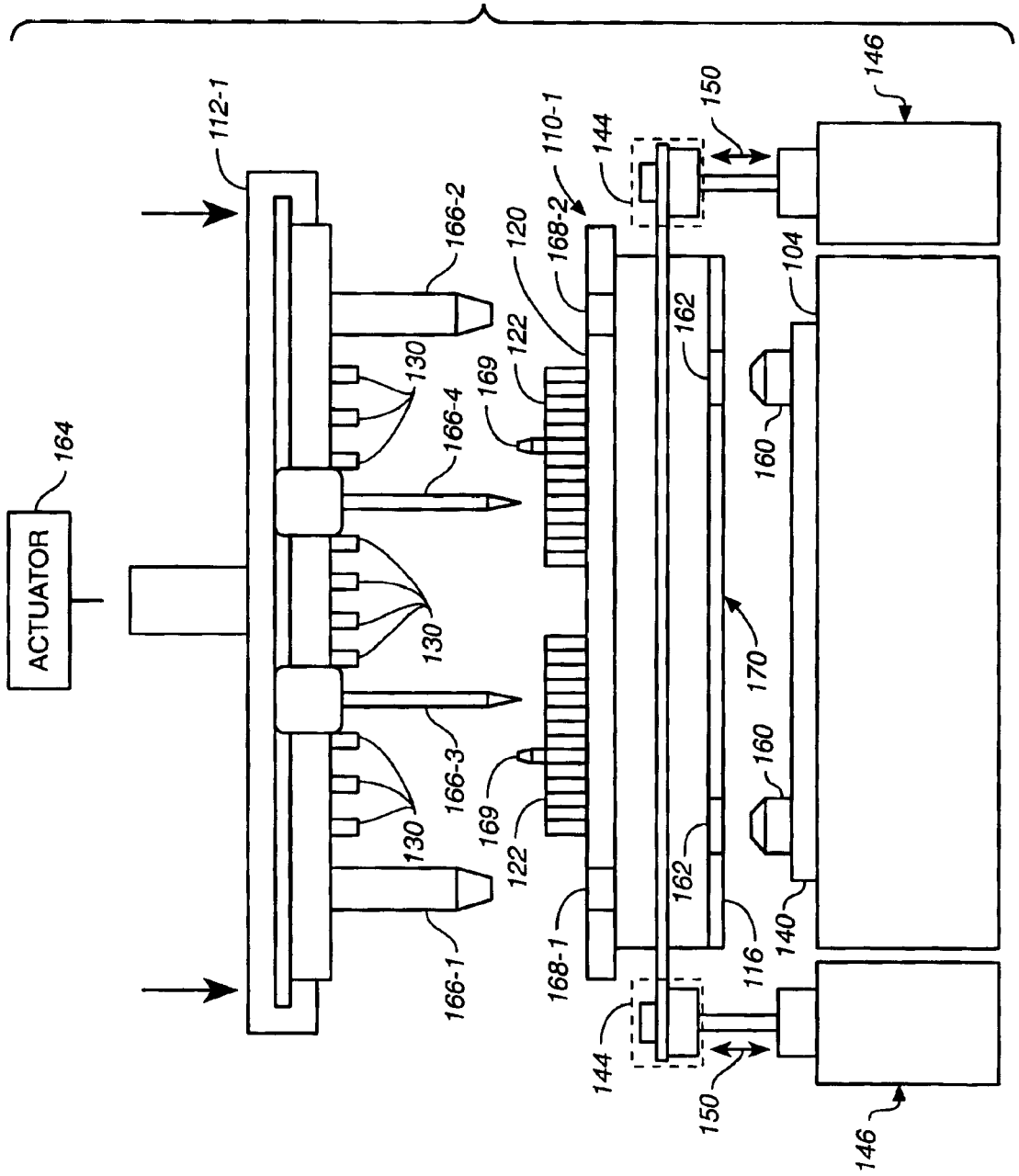

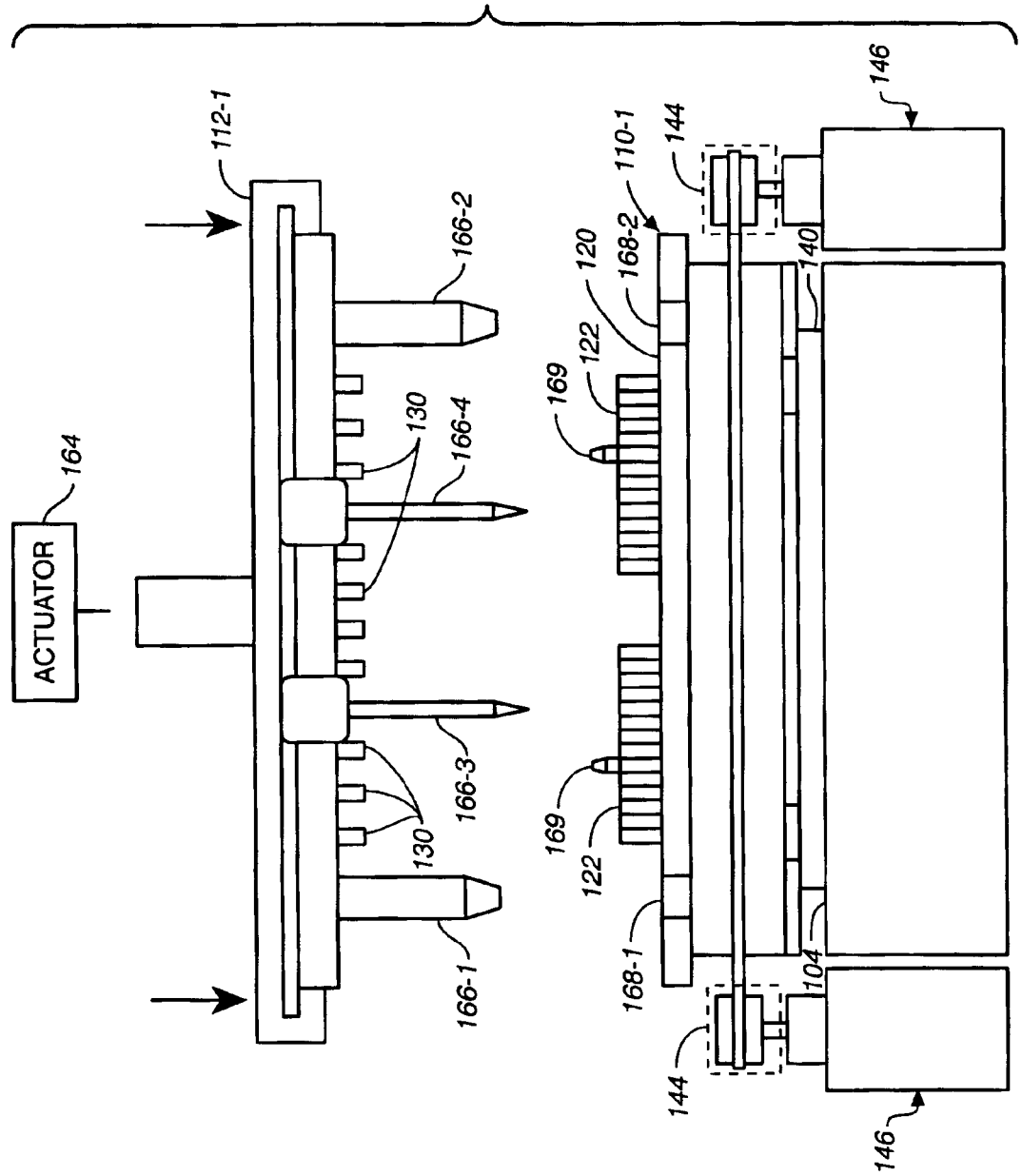
FIG._3-2

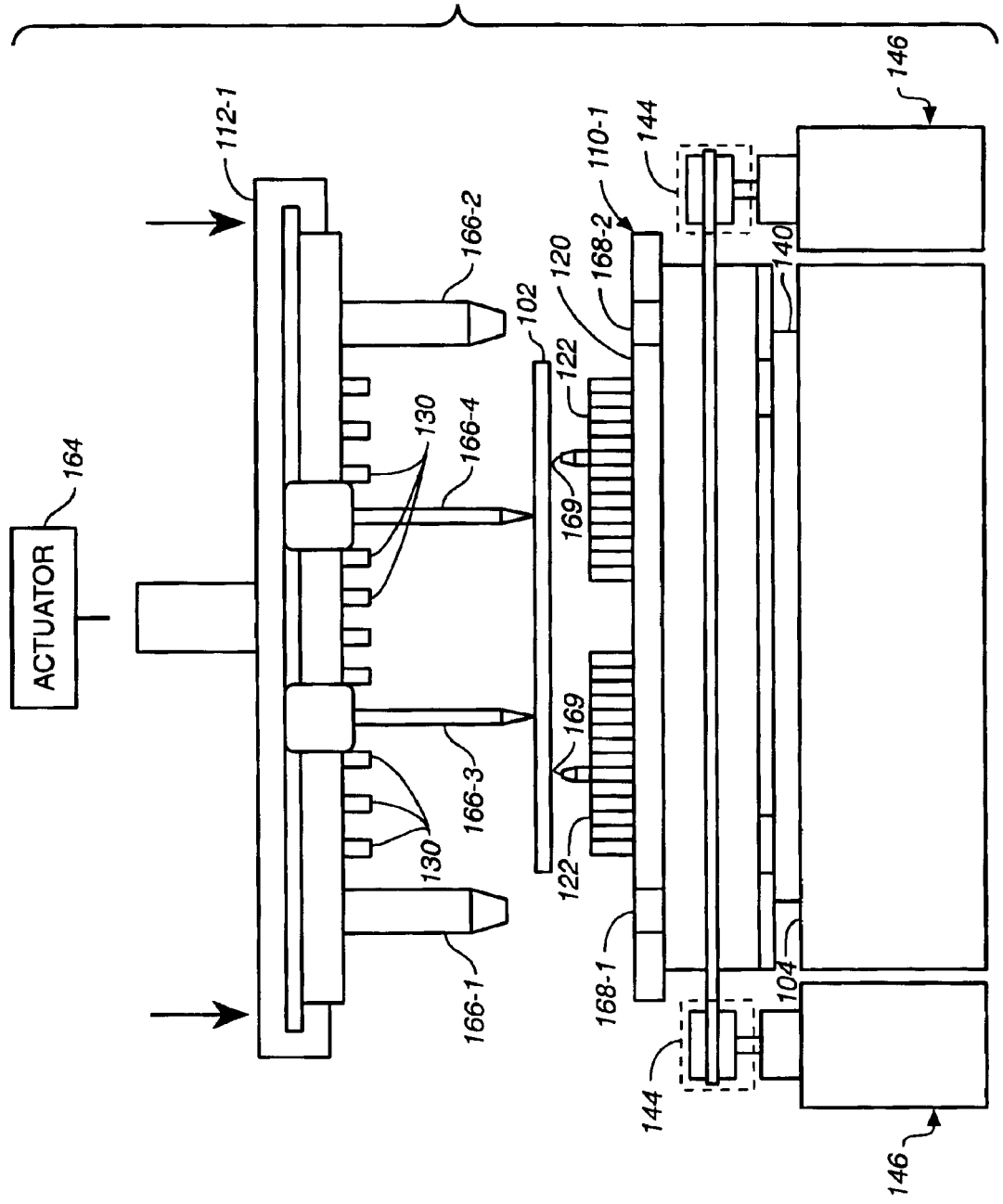

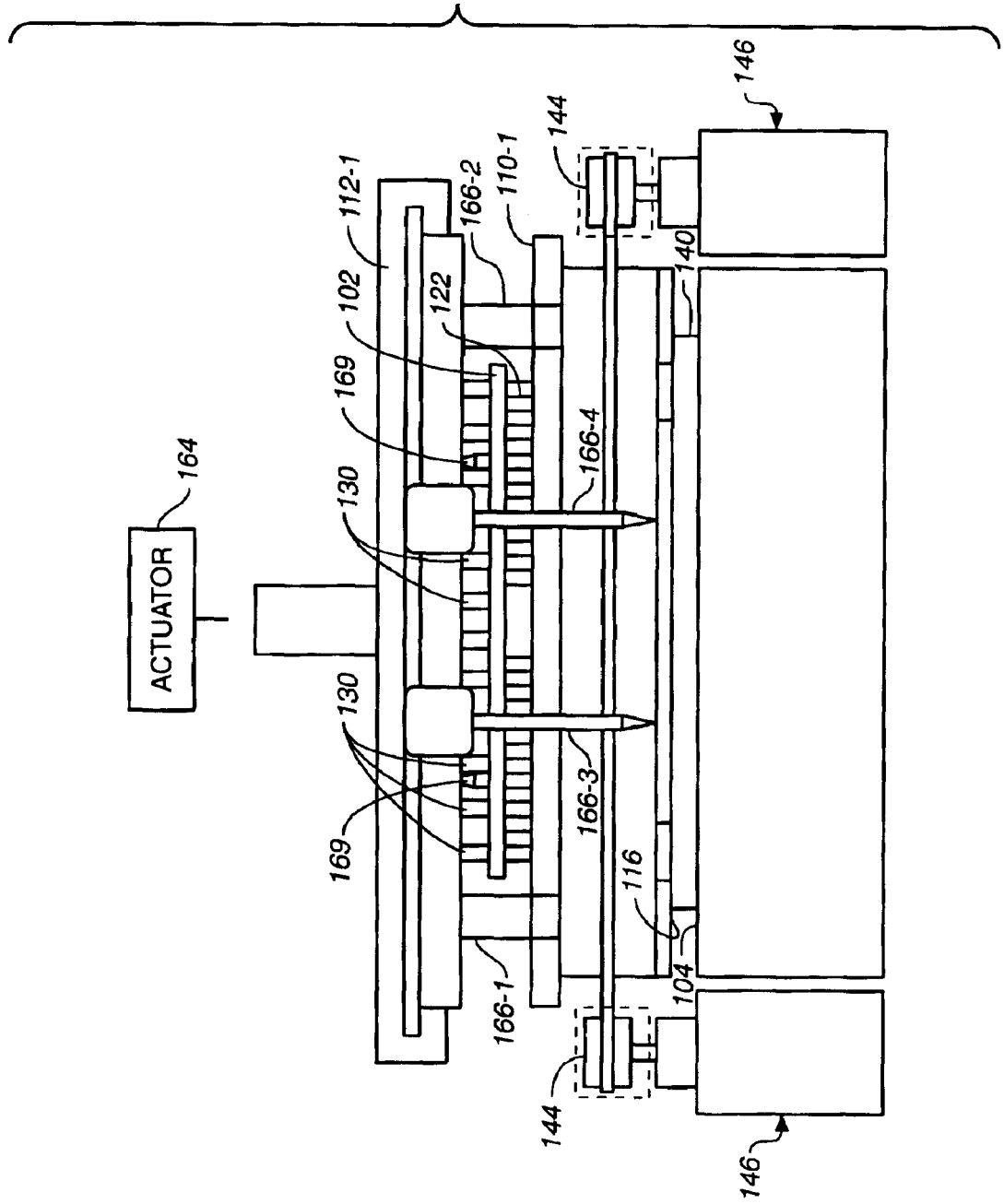
FIG._3-4

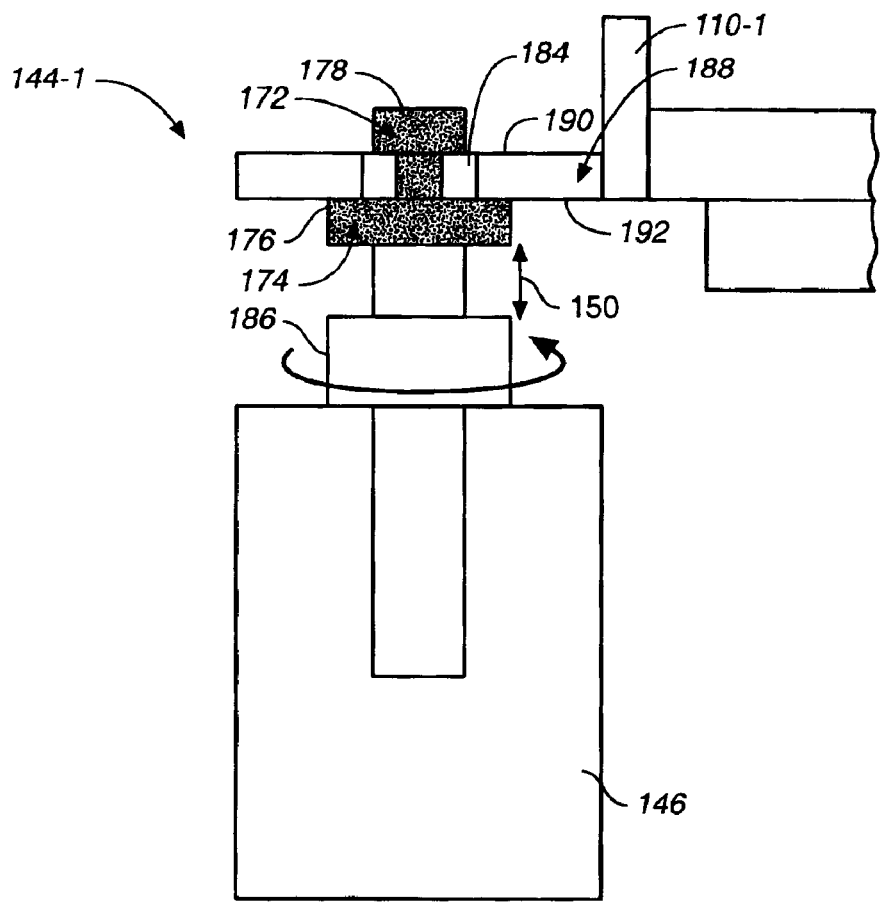
FIG._4-1
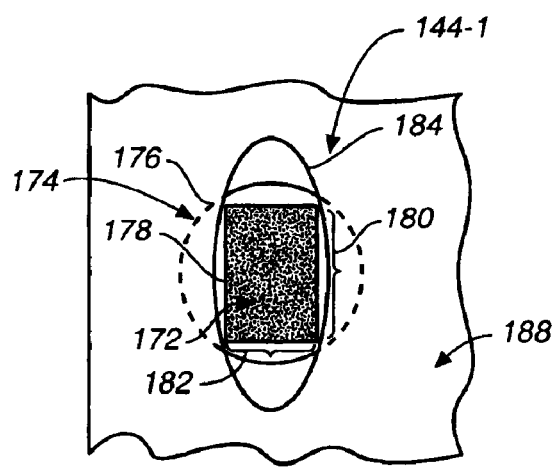
FIG._4-2

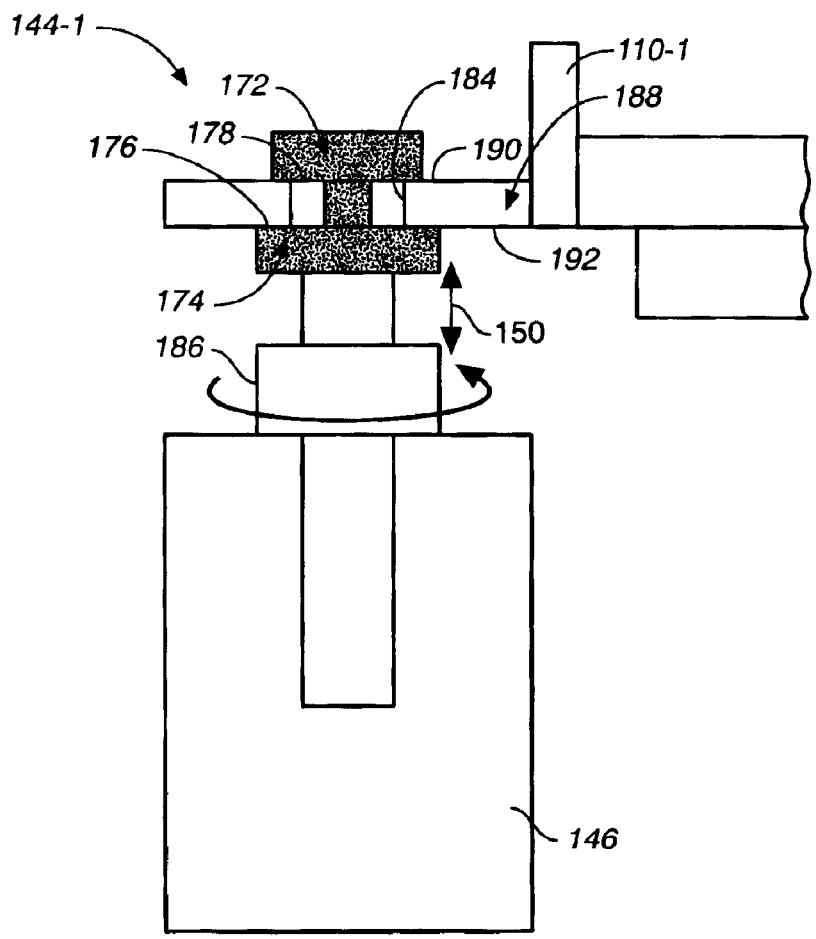
FIG._4-3
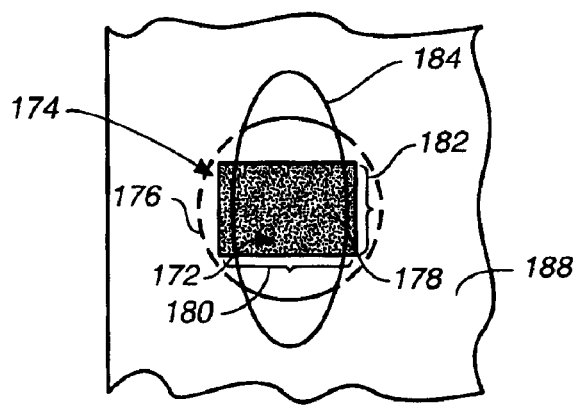
FIG._4-4

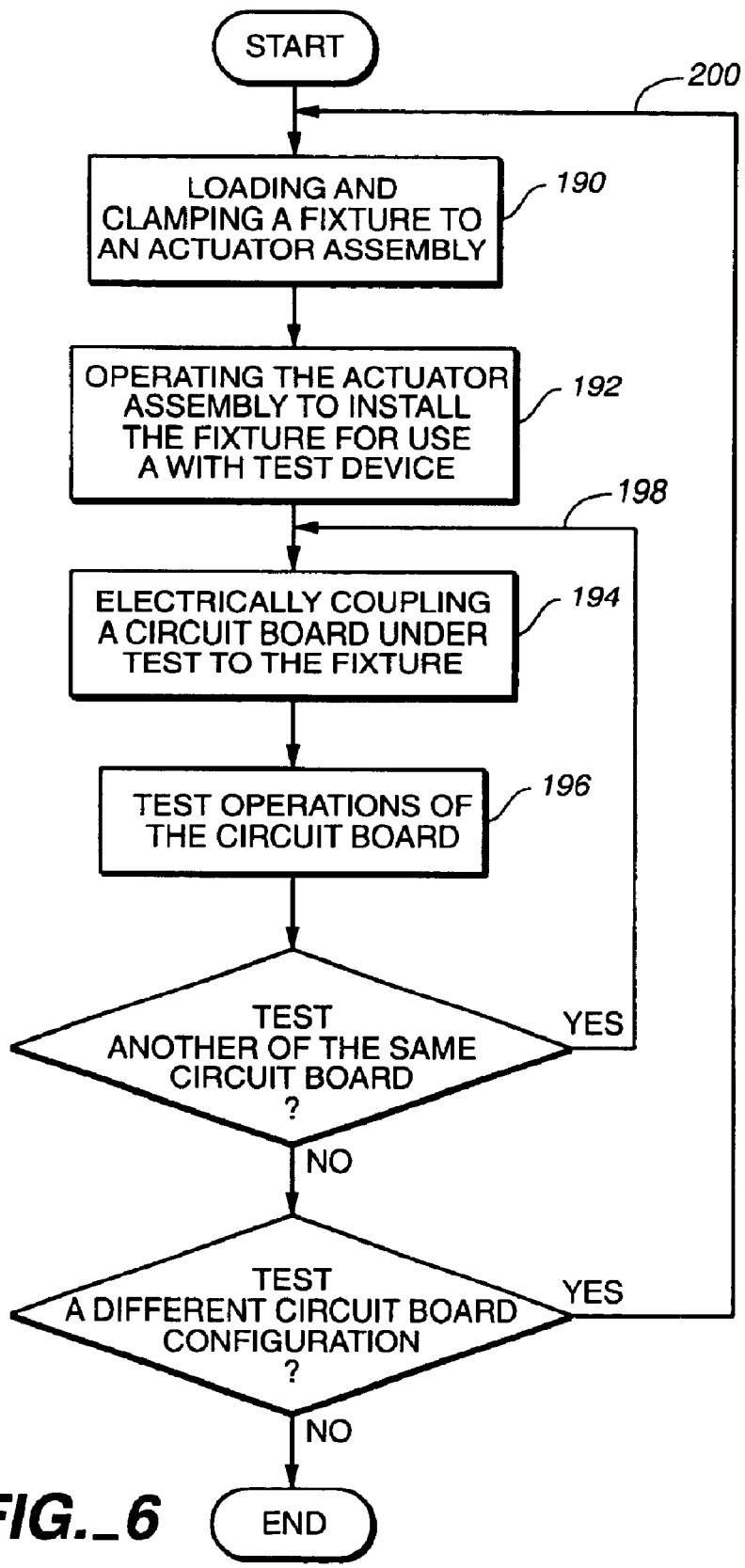
FIG._6

TEST FIXTURE ASSEMBLY FOR PRINTED CIRCUIT BOARDS

CROSS-REFERENCE TO RELATED APPLICATION

The present application claims priority to Provisional Application Ser. No. 60/255,262 filed Dec. 13, 2000 and entitled "PNUEMATIC ACTUATED CLAMP SYSTEM."

FIELD OF THE INVENTION

The present invention relates generally to a test apparatus and associated method for circuit boards and more, particularly, but not by limitation to a circuit board test apparatus and method adaptably interfacing to different circuit board configurations.

BACKGROUND OF THE INVENTION

Circuit board operation is tested prior to assembly of circuit boards in various products to verify operational integrity of the circuit board components. For test operations, an electrical connection or interface is made between the circuit components of the circuit board and test equipment or a test engine. The electrical connection or interface between the test equipment and the circuit board is established through a test fixture. The test fixture includes first and second interfaces including a plurality of terminals and the test fixture includes a plurality of leads electrically connecting the plurality of terminals on the first interface to the plurality of terminals on the second interface. For test operations, terminals on the first interface electrically couple to terminals or probes on the test equipment and terminals on the second interface electrically couple to terminals of a circuit board under test.

Different circuit board designs have different terminal or electrical configurations and thus different test fixtures with different terminal or electrical configurations are used to test different circuit board configurations. Test fixtures are removably coupled to the test equipment to install different test fixtures depending upon the circuit board configuration under test. For accurate test operations, terminals on the first interface of the test fixture must be accurately aligned with terminals or probes of the test equipment and terminals on the second interface must be accurately aligned with terminals on the circuit board under test to assure proper electrical connection between the test equipment or assembly and the circuit board. The process of aligning and assembling the test fixture relative to the test assembly can be time consuming and alignment can be difficult slowing test operations. Embodiments of the present invention address this and other problems and provides advantages and features not recognized nor appreciated by the prior art.

SUMMARY OF THE INVENTION

The present invention relates generally to a test system for testing operation of a circuit board. The test system includes a fixture for providing an electrical interface between a test engine or device and a particular circuit board. The test fixture is selectively clamped and/or loaded onto an actuator which moves the fixture from a first position spaced from the test device to a second position where the test fixture is electrically connected with circuitry of the test device for installation. These and various other features as well as advantages which characterize embodiments of the present invention will be apparent upon reading the following detailed description and review of the associated drawings.

BRIEF DESCRIPTION OF THE DRAWINGS

FIG. 1 is a schematic illustration of a test system for printed circuit boards.

FIG. 2 is an exploded illustration of a test assembly for coupling terminals on a printed circuit board to a test engine or test equipment.

FIGS. 3-1 through 3-4 are schematic illustrations of an embodiment of a test system in accordance with an embodiment of the present invention progressively illustrating installation of a test fixture relative to a test engine or equipment for testing operations.

FIGS. 4-1 and 4-2 schematically illustrate an embodiment of a clamp shown in a first position or orientation for loading a fixture for installation.

FIGS. 4-3 and 4-4 schematically illustrate the embodiment of the clamp shown in FIGS. 4-1 and 4-2 in a clamped position or orientation for installation of the test fixture.

FIG. 6 is a flow chart illustrating operating steps for testing a printed circuit board.

DETAILED DESCRIPTION OF ILLUSTRATIVE EMBODIMENTS

Figure 5:
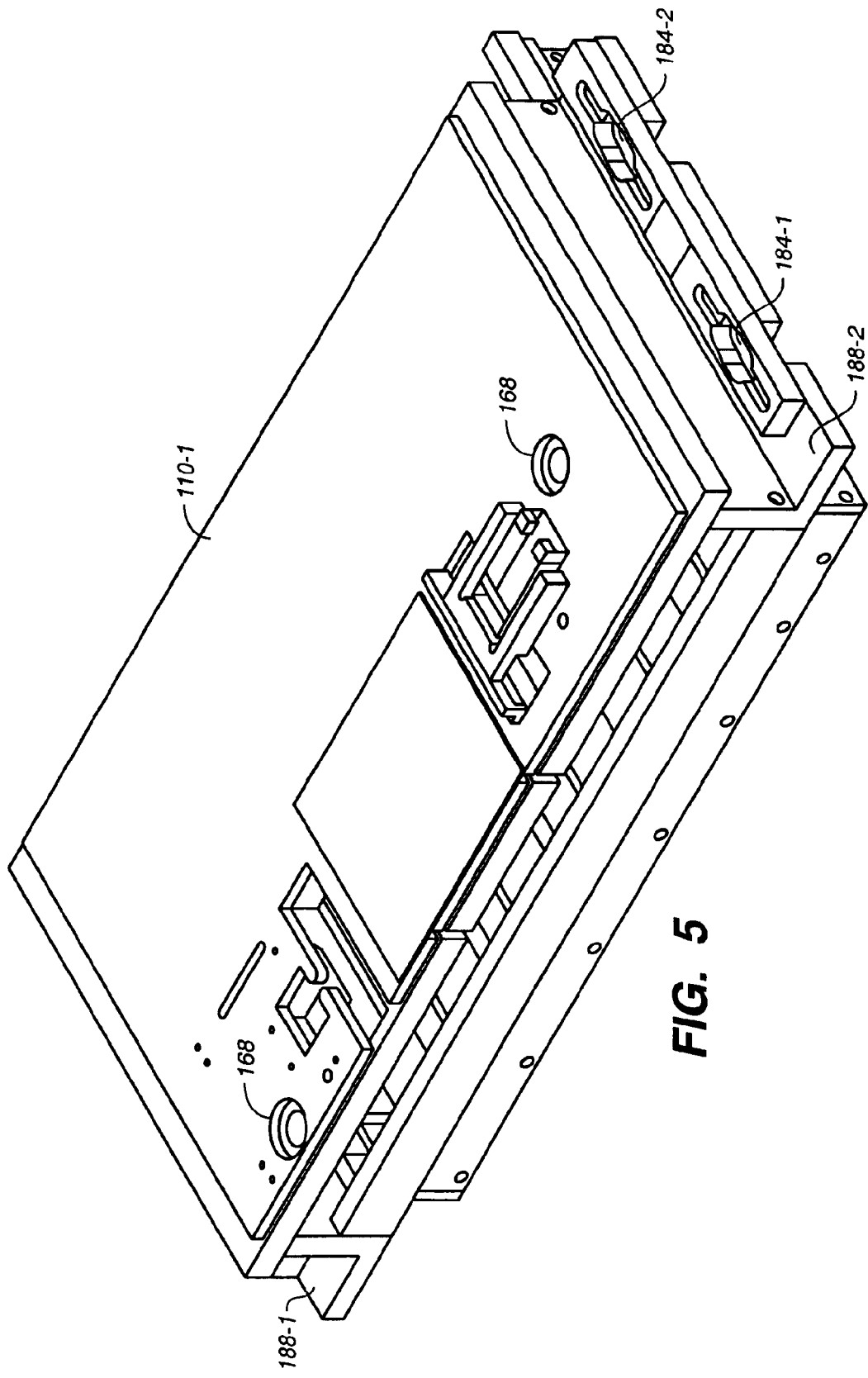
FIG. 5 is a perspective illustration of an embodiment of a test fixture including opposed mounting ledges for loading and clamping the fixture for installation.

FIG. 1 is a schematic illustration of a test system 100 for a printed circuit board 102. As shown, the test system 100 includes a test engine or device 104 illustrated schematically which electrically interfaces with the circuit board 102 for test operations through a test fixture 110. In the illustrated embodiment shown in FIG. 1, the system includes a cover 112 which is electrically coupled to the test engine 104 and electrically interfaces with the circuit board 102 for test operations. A particular circuit board 102 under test is positioned relative to the fixture 110 and the cover 112 to electrically couple to the test engine 104 through terminals on the fixture 110 and cover 112 and preset terminals or probes 114 on the test engine 104.

In the fixture embodiment shown, fixture 110 includes a first interface surface 116 including a plurality of terminals 118 and a second interface surface 120 also including a plurality of terminals 122. As shown in FIG. 1, the first and second interface surfaces 116, 120 are orientated in opposed directions. The fixture 110 is installed as illustrated by line 126 relative to test engine 104 so that terminals 118 on interface surface 116 operably couple to selected terminals or probes 114 on the test engine 104. For test operations, terminals 122 on interface surface 120 couple to terminals 124 on the circuit board 102 under test. Terminals 118 are electrically coupled to terminals 122 as illustrated schematically by lines 128 to provide an electrical interface or connection between the circuit board 102 under test and the test equipment or test engine 104.

In the fixture embodiment shown, fixture 110 includes a first interface surface or first interface 116 including a plurality of terminals 118 and a second interface surface or second interface 120 also including a plurality of terminals 122. As shown in FIG. 1, the first and second interface surfaces 116, 120 are orientated in opposed directions. The fixture 110 is inatalled as illustrated by line 126 relative to test engine 104 so that terminals 118 on interface surface 116 operably couple to selected terminals or probes 114 on the test engine 104. For test operations, terminals 122 on interface surface 120 couple to terminals 124 on the circuit board 102 under test. Terminals 118 are electrically coupled to terminals 122 as illustrated schematically by lines 128 to provide an electrical interface or connection between the circuit board 102 under jest and the test equipment or test engine 104.

FIG. 2 illustrates an assembly arrangement for installing a particular fixture to electrically couple a circuit board 102 being tested to the test engine 104. In the embodiment shown in FIG. 2, fixture 110 is assembled relative to an adapter plate 140 coupled to the test engine or device 104 by vacuum pressure supplied through a vacuum port 142. As shown, vacuum pressure is supplied through vacuum port 142 so that the fixture 110 is biased toward terminals (not shown) on the adapter plate 140 to provide an electrical connection between the circuit board 102 and the test engine 104. Maintaining proper alignment of the fixture interface can be difficult if there is not proper air sealing between the components or there is warpage of the components of the system. Alignment difficulties can slow testing operation and reduce testing reliability.

Embodiments of the present invention relates to a test system including an installation assembly to selectively install a particular fixture for test operations. FIGS. 3-1 through 3-4 schematically illustrate an embodiment of a test assembly to install different fixtures relative to test engine 104 for testing different printed circuit boards, where like numbers are used to refer to like parts in the previous FIGS. As shown in FIGS. 3-1 through 3-4, the assembly includes a clamp assembly 144 and an actuator 146 to install a clamped fixture 110 relative to the test engine 104 for installation of different fixtures for different circuit board configurations.

As shown in FIGS. 3-1 and 3-2, clamp assembly 144 is coupled to actuator 146 and movable thereby so that fixture 110-1 is clamped relative to the actuator 146 and so that actuator 146 moves fixture 110-1 as illustrated by arrow 150 between an extended or raised position shown in FIG. 3-1 and an installed position shown in FIG. 3-2 to install the fixture for test operations. In the extended or raised position shown in FIG. 3-1, the fixture 110-1 is spaced from the test engine 104 and in the installed position shown in FIG. 3-2, the fixture is lowered towards the test engine 104 to electrically couple the fixture 110-1 to the test engine 104.

In the embodiment shown, a pneumatic piston-cylinder actuator is used to move the fixture 110-1 between the extended or raised position and the installed position to install a particular fixture for test operations. Guide pins 160 on the adapter plate 140 insert into guide holes 162 on the fixture 110-1 to align the fixture 110-1 for installation. Although a pneumatic piston cylinder is described, application is not so limited and alternate actuator systems can be employed to move the supported fixture between the raised position and installed position.

FIGS. 3-3 and 3-4 illustrate an operating sequence embodiment for testing a circuit board through the fixture interface. As shown in FIG. 3-3, the circuit board 102 is aligned relative to the fixture 110-1. In the embodiment shown, a cover 112-1 is moved towards fixture 110-1 via actuator 164 as progressively illustrated in FIGS. 3-3 and 3-4. Cover 112-1 is lowered towards fixture 110-1 so that guide pins 166-1, 166-2 on cover 112-1 extend into guide holes 168-1, 168-2 on the fixture 110-1 to align the cover 112-1 relative to the fixture 110-1 for accurate interface connection.

Cover 112-1 also includes guide pins 166-3, 166-4 which extend through holes on the circuit board 102 and fixture 110-1 as illustrated in FIG. 3-4 to align the circuit board 102 to be tested with the fixture base 110-1 and cover 112-1. Also, as shown, fixture 110-1 includes guide pin 169 for insertion through circuit 102 to align the circuit board 102 relative to the test fixture 110-1. Thus, as shown progressively illustrated in FIGS. 3-3 and 3-4, actuator 164 lowers cover 112-1 to bias the circuit board 102 being tested toward fixture 110-1 and to electrically couple terminals on the circuit board 102 to the fixture terminals and cover for electrical interface with the test circuitry of the test engine 104 and assembly.

In the illustrated embodiment of FIGS. 3-1 through 3-4, fixture 110-1 includes a test board 170 including a plurality of test terminals (not shown) to form the first interface 116 to couple the fixture 110-1 to terminals or probes of the test engine 104. A plurality of probes or pins (not shown) are coupled to the test board 170 to provide an electrical interface between terminals on the test board 170 and terminals 122 on the second interface 120 formed by a tip portion of the pins or probes. Although a particular fixture circuit structure has been described, it should be understood that application of embodiments of the present invention is not limited to the fixture structure embodiment described.

FIGS. 4-1 through 4-4 illustrate an embodiment of a clamp assembly 144-1 to install fixture 110-1 relative to the test engine 104 where the fixture 110-1 is loaded, clamped and installed relative to the test engine for test operations. As shown, clamp assembly 144-1 includes first and second clamp members 172, 174 supported in spaced relation. Clamp member 174 includes an enlarged head 176 to form a support surface to load fixture 110-1 for assembly by actuator 146 as shown in FIGS. 4-1 and 4-2. Clamp member 172 includes a head 178 having an elongated dimension 180 and a narrowed dimension 182 as shown in FIG. 4-2. Fixture 110-1 includes a clamp opening 184 also shaped with an elongated length dimension and a narrowed dimension so that the head 178 of clamp member can be inserted through opening 184 in a first orientation with the elongated length dimension 180 aligned with the elongated length dimension of clamp opening 184 to load the fixture for installation as illustrated in FIGS. 4-1 and 4-2. The enlarge head 176 of clamp member 174 restricts insertion of clamp member 174 through opening 184 to support the fixture 110-1 to load the fixture for installation.

To clamp the fixture for installation, a clamp rotator 186 rotates the clamp member 172 from a first orientation where the elongated length 180 is aligned with the elongated length dimension of clamp opening 184 as shown in FIGS. 4-1 and 4-2 to a second orientation shown in FIGS. 4-3 and 4-4. In the second orientation, the elongated length 180 of the clamp member 172 is aligned with the narrowed dimension of clamp opening 184. The clamp members 172, 174 are spaced relative a thickness of a ledge 188 portion of the fixture 110-1 having the clamp opening 184 so that in the second orientation, the elongated length 180 of clamp member 172 abuts a surface 190 of fixture 110-1 while surface 192 of fixture 110-1 is supported on enlarge head 176 of clamp member 174 to secure fixture 110-1 therebetween. Thereafter, actuator 144 moves clamp members 172, 174 (with the fixture 110-1 secured therebetween) toward the test engine 104 as shown in FIG. 3-2 to install the fixture. Thus, as described, fixture 110-1 can be easily loaded for test operations without extensive installation delay. Although a particular clamp structure is illustrated in FIGS. 4-1 through 4-4 for loading and clamping the fixture for installation, application is not limited to the particular structure shown.

Subsequent to use for a particular circuit board, the test fixture 110-1 is unloaded. The test fixture 110-1 is unloaded by extending actuator 146 to bias head or support surface 176 against fixture 110-1 to raise fixture 110-1. Thereafter, rotator 186 rotates clamp member 172 to unclamp the fixture 110-1 and the fixture 110-1 is removed to install a different test fixture if desired. FIG. 5 is a perspective illustration of an embodiment of a test fixture 110-1. As shown, the test fixture 110-1 includes opposed side ledges 188-1, 188-2 including spaced clamp openings 184 to secure the fixture 110-1 to multiple actuators for installation. In the illustrated embodiment each side ledges 188-1, 188-2 includes openings 184-1, 184-2 positioned on opposed ends of ledges 188-1, 188-2 to secure the fixture 110-1 for installation proximate to four corner of the fixture. Although, the test fixture 110-1 shown in FIG. 5 includes four clamp openings, application of the assembly of the present invention is not limited to the particular embodiments shown.

FIG. 6 is an operation flow chart for testing circuit boards of different configurations in accordance with one embodiment of the present invention. As shown a fixture for a particular circuit board under test is loaded for installation and clamped or secured to the actuator assembly as illustrated in block 190. The actuator assembly is operated pneumatically or otherwise to lower the clamped fixture to install the fixture relative to the test device for operation as illustrated by block 192. The circuit board being tested is electrically coupled to the fixture as illustrated by block 194 and operation of the circuit board is tested as illustrated by block 196. Sequential circuit boards are electrically coupled to the fixture as illustrated by line 198 for testing operations. As illustrated by line 200 the fixture is unloaded and a different fixture is installed to test a circuit board having a different design or configuration.

A test system for testing operation of a circuit board, the test system includes a fixture (such as 110-1) for providing an electrical interface between a test engine or device (such as 104) and a particular circuit board (such as 102). The test fixture is selectively clamped (such as 146) to an actuator (such as 144) which moves the fixture from a first position spaced from the test engine or device to a second position to electrically interface with circuitry of the test engine.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the fill extent indicated by the broad general meaning of the terms in which the appended claims are expressed. For example, the particular elements may vary depending on the particular application while maintaining substantially the same functionality without departing from the scope and spirit of the present invention. In addition, although preferred embodiments are described herein, it will be appreciated by those skilled in the art that the teachings of the present invention can be applied to other systems, without departing from the scope and spirit of the present invention.

What is claimed is:

1. A test fixture assembly for testing a printed circuit board comprising:
a fixture including a first interface having a plurality of interface terminals adapted to electrically couple the fixture to a test device and a second interface having a plurality of interface terminals adapted to electrically couple the fixture to terminals on the printed circuit board and the plurality of interface terminals on the second interface being electrically coupled to the plurality of interface terminals on the first interface;
an actuator operably coupled to the fixture to install the fixture relative to the test device and the actuator movably supporting to move the fixture between a first position to support the fixture at a position spaced from the test device and a second position to install the fixture relative to the test device to provide an electrical connection between the plurality of interface terminals on of the first interface of the fixture and the test device and including an actuator to bias the printed circuit board relative to the plurality of interface terminals of the second interface to provide an electrical connection to the test device; and
a clamp assembly adapted to selectively secure the fixture relative to the actuator operably coupled to the fixture to install the fixture.

2. The test fixture assembly of claim 1 and further comprising a rotator coupled to the clamp assembly to rotate the clamp assembly between a first orientation to load the fixture and a second orientation to clamp the fixture for installation.

3. The test fixture assembly of claim 1 wherein the clamp assembly includes first and second clamp members having opposed clamp surfaces to secure the fixture therebetween and one of said clamp members forms a support member to load the test fixture for installation.

4. The test fixture assembly of claim 3 wherein the fixture includes an elongated clamp opening having an elongated dimension and a narrower dimension and the other of said clamp members includes a head having an elongated dimension and a narrower dimension and the head is sized for insertion through the clamp opening in a first orientation with the elongated dimension of the head aligned with the elongated dimension of the clamp opening and the other of said clamp members being rotatable to a second orientation to align the elongated dimension of the head with the narrower dimension of the clamp opening to clamp the fixture relative to the one of said clamp members which forms the support member for installation.

5. The test assembly of claim 1 and further including a cover including interface terminals electrically coupleable to the circuit board terminals for testing and the actuator biasing the printed circuit board relative to the plurality of interface terminals of the second interface to provide an electrical connection to the cover.

6. The test fixture assembly of claim 1 wherein the fixture includes guide holes for insertion of guide pins on the test device or a cover.

7. The test fixture assembly of claim 1 wherein the first interface is orientated in a first direction and the second interface is orientated in a second opposed direction from the first direction.

8. The test fixture assembly of claim 1 wherein the actuator operably coupled to the fixture includes is a piston-cylinder actuator.

9. The test fixture assembly of claim 8 wherein the piston-cylinder actuator is pneumatically operated.

10. The test fixture assembly of claim 1 and comprising at least four clamp assemblies coupleable to at least four clamp openings on the fixture.

11. A test assembly comprising:
a fixture including a first interface having a plurality of interface terminals adapted to electrically couple the fixture to a test engine and a second interface having a plurality of interface terminals adapted to electrically couple the fixture to terminals on a printed circuit board and the plurality of interface terminals on the first interface being electrically connected to the plurality of interface terminals on the second interface; and means for removably installing the fixture to the test engine to provide an electrical connection between the interface terminals on the first interface and the test engine and a printed circuit board under test.

12. The test assembly of claim 11 wherein the means for removably installing includes a clamp assembly including opposed clamp members, one of said clamp members forming a support surface to load the fixture for installation and the other of said clamp members being positionable between a load position and a clamped position to clamp the fixture to the test engine.

13. The test assembly of claim 12 wherein the clamp assembly is coupled to an actuator movable between a first position spaced from the test engine to load the fixture on the support surface and a second position proximate to the test engine to provide the electrical connection between the interface terminal on the fixture and the test engine to install the fixture.

14. A method for testing circuit boards comprising steps of:

removably clamping a fixture having a first interface having a plurality of interface terminals and a second interface having a plurality of interface terminals electrically coupled to the plurality of interface terminals on the first interface to an actuator assembly; and operating the actuator assembly to move the fixture from a first position spaced from a test device to a second position so that the terminals of the first interface electrically interface with terminals on the test device to install the fixture for use; and biasing at least one circuit board relative to the plurality of interface terminals of the second interface to test the at least one circuit board.

15. The method of claim 14 wherein the step of removably clamping the fixture comprising:

loading the fixture onto a support surface coupled to the actuator assembly and clamping the fixture relative to the support surface.

16. The method of claim 15 wherein the step of removably clamping the fixture relative to the support surface comprises rotating a clamp member from a first orientation to a second orientation.

17. The method of claim 14 and further comprising the steps of:

sequentially biasing a plurality of circuit boards relative to the plurality of interface terminals on the second interface; and sequentially testing operation of the plurality of circuit boards.

18. The method of claim 14 and further comprising the steps of:

operating the actuator assembly to retract the fixture from the test device;

unclamping the fixture from the actuator assembly; and removing the fixture and installing a different fixture relative to the test device.

19. The method of claim 14 and further comprising the steps of:

positioning the at least one circuit board between the fixture and a cover having interface terminals; and biasing the cover relative to the at least one circuit board to electrically connect the circuit board to the plurality of interface terminals on the fixture and the cover.

20. A test device assembly comprising:

a test circuit adapted to electrically test a circuit board; and clamp assembly operable to removably couple a fixture to an actuator assembly and the actuator assembly operable to install the fixture relative to the test circuit through an electrical interface between the test circuit and a plurality of interface terminals on a first interface of the fixture to provide an electrical interface for the circuit board to the test circuit through a plurality of interface terminals on a second interface of the fixture.

21. The test device assembly of claim 20 wherein the test device include the fixture movable between a retracted position and an installed position relative to the test circuit.

22. The test device assembly of claim 21 wherein the test circuit comprises a base and a cover to provide an electrical interface relative to opposed sides of the circuit board through the fixture installed relative to the base and through interface terminals on the cover.

* * * * *